United States Patent
Iwata et al.

(10) Patent No.: US 7,541,655 B2
(45) Date of Patent: Jun. 2, 2009

(54) SEMICONDUCTOR DEVICE AND WIRING METHOD FOR SEMICONDUCTOR DEVICE

(75) Inventors: Akio Iwata, Kawasaki (JP); Gaku Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 328 days.

(21) Appl. No.: 11/245,049

(22) Filed: Oct. 7, 2005

(65) Prior Publication Data
US 2006/0273407 A1    Dec. 7, 2006

(30) Foreign Application Priority Data
Jun. 7, 2005    (JP) .............................. 2005-166864

(51) Int. Cl.
*H01L 29/76* (2006.01)
*H01L 29/94* (2006.01)
*H01L 31/062* (2006.01)
*H01L 31/113* (2006.01)

(52) U.S. Cl. ....................... 257/393; 257/903
(58) Field of Classification Search ................. 257/393, 257/903–904, E27.098
See application file for complete search history.

(56) References Cited

U.S. PATENT DOCUMENTS

| 5,166,902 | A |  | 11/1992 | Silver |
| 5,455,787 | A |  | 10/1995 | Kawasima |
| 5,814,844 | A |  | 9/1998 | Nagata et al. |
| 5,892,261 | A | * | 4/1999 | Lin et al. ..................... 257/903 |
| 6,741,505 | B2 |  | 5/2004 | Yokozeki |
| 6,921,936 | B2 |  | 7/2005 | Kudo |

FOREIGN PATENT DOCUMENTS

| CN | 1495904 | 5/2004 |
| EP | 0 933 817 | 6/1999 |
| JP | 2-89360 | 3/1990 |
| JP | 6-89586 | 3/1994 |
| JP | 6-275795 | 9/1994 |
| JP | 2003-109379 | 4/2003 |
| KR | 2003-0082916 | 10/2003 |

OTHER PUBLICATIONS

Korean office action mailed on Oct. 17, 2006 in corresponding Korean patent application No. 10-2005-0103738.

* cited by examiner

*Primary Examiner*—Cuong Q Nguyen
(74) *Attorney, Agent, or Firm*—Staas & Halsey LLP

(57) ABSTRACT

A semiconductor device includes: a first circuit in which a diffusion area A1, a first gate G1, a diffusion area A2, a second gate G2 and a diffusion area A3 constitute two transistors; and a second circuit in which a diffusion area B1, the first gate G1, a diffusion area B2, the second gate G2 and a diffusion area B3 constitute two transistors. The diffusion areas A1 and B3, the diffusion areas A2 and B2 and the diffusion areas A3 and B1 are connected. Alternatively, the diffusion areas A1, A3 and B2 and the diffusion areas A2, B1 and B3 are connected.

2 Claims, 7 Drawing Sheets

Fig.1a --RELATED ART--
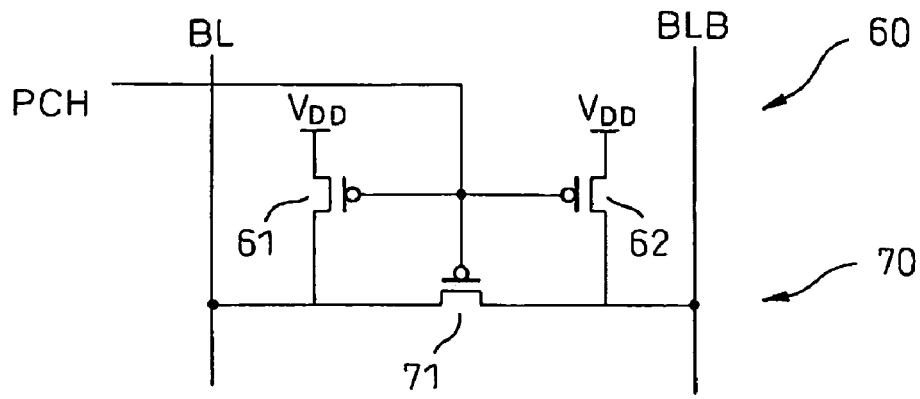
Fig.1b --RELATED ART--
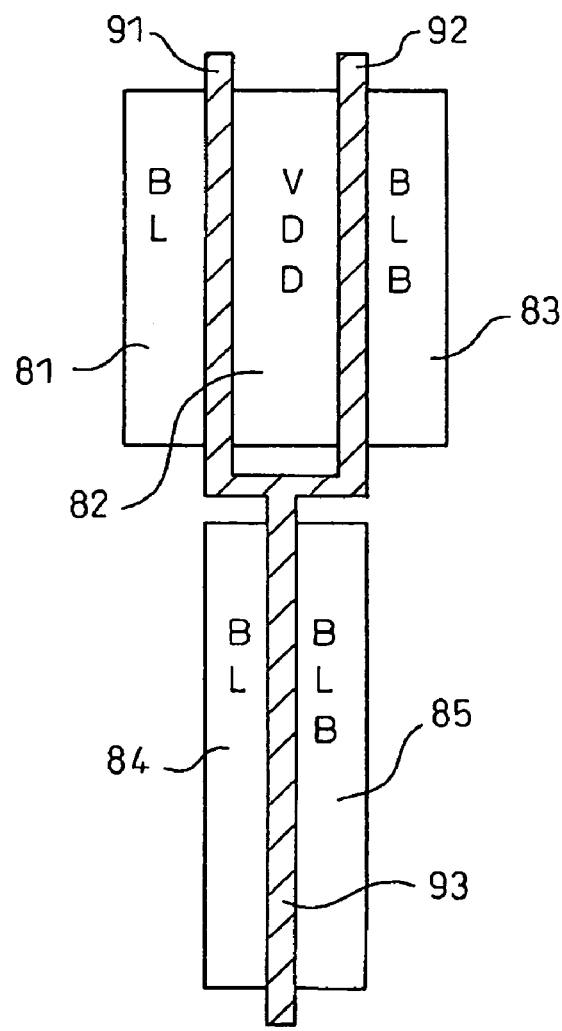

Fig.2a --RELATED ART--
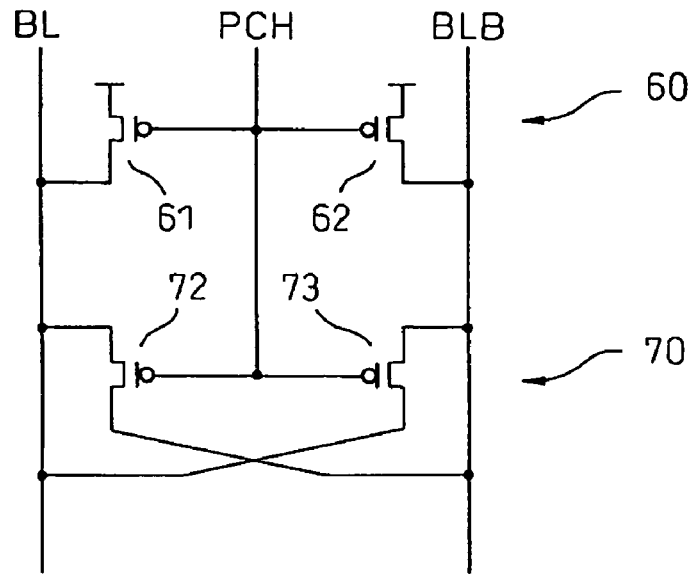
Fig.2b --RELATED ART--
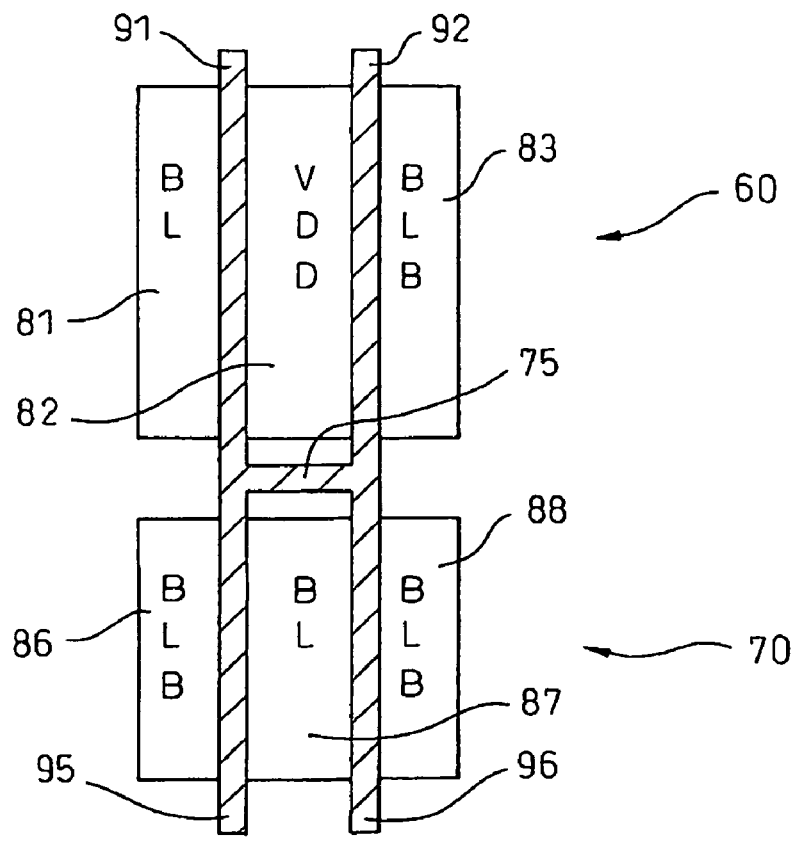

Fig.3 --RELATED ART--
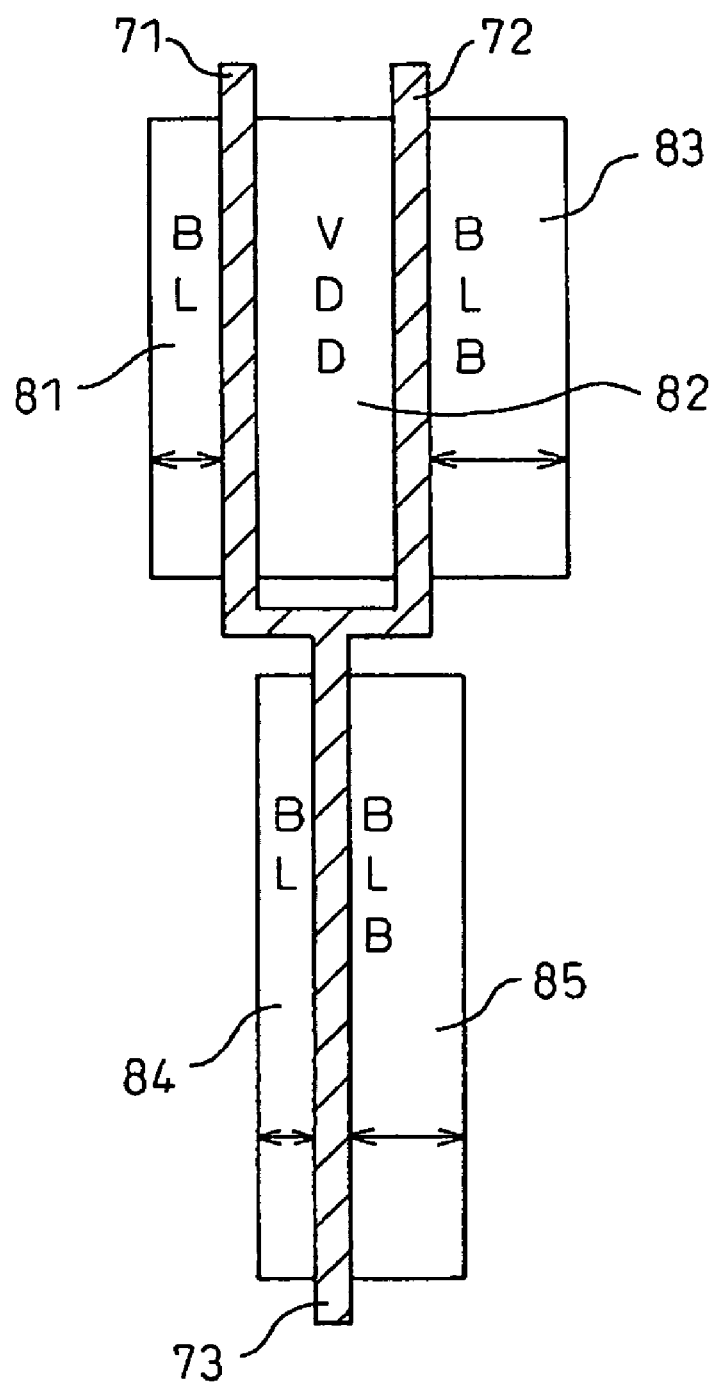

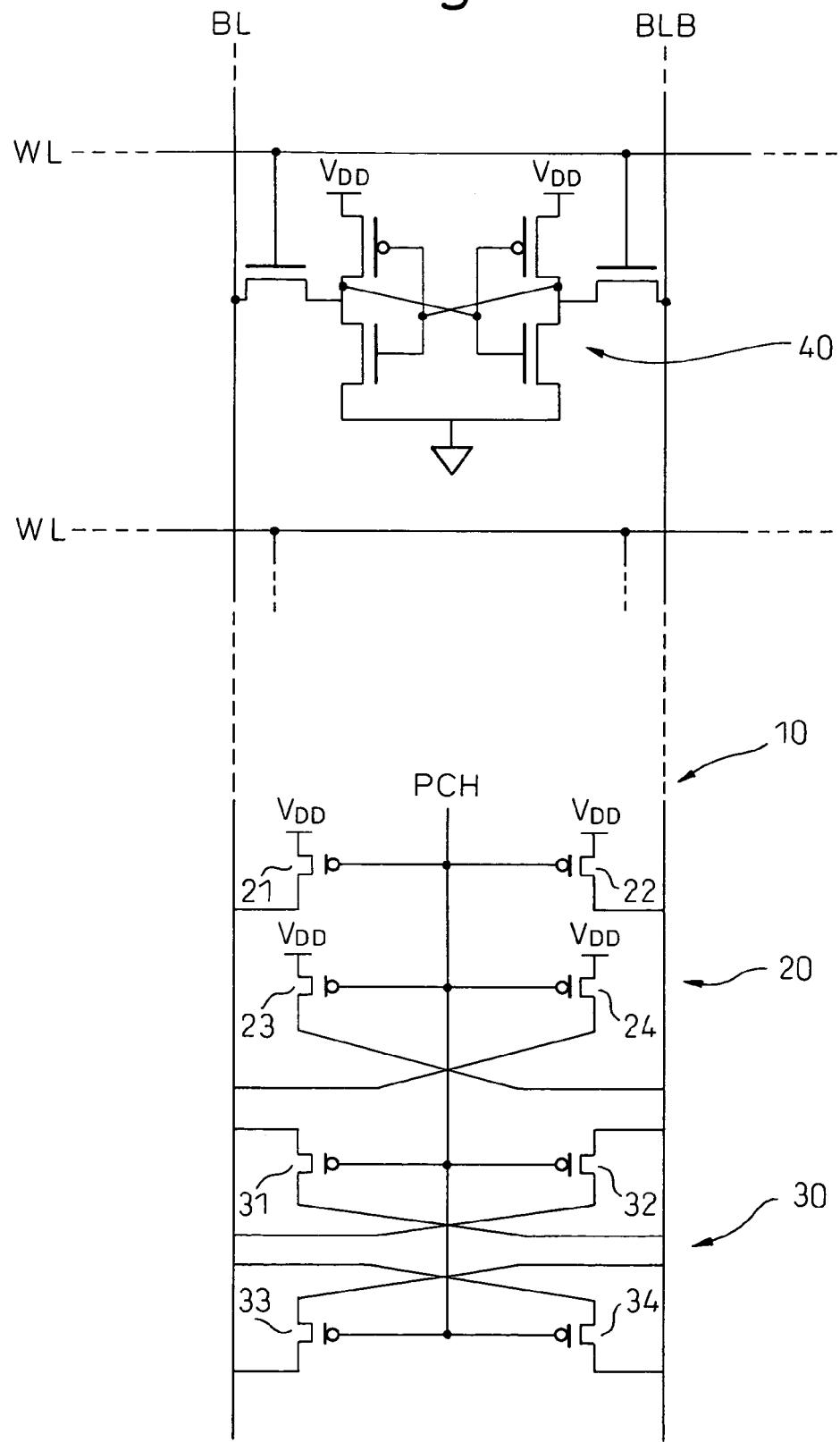

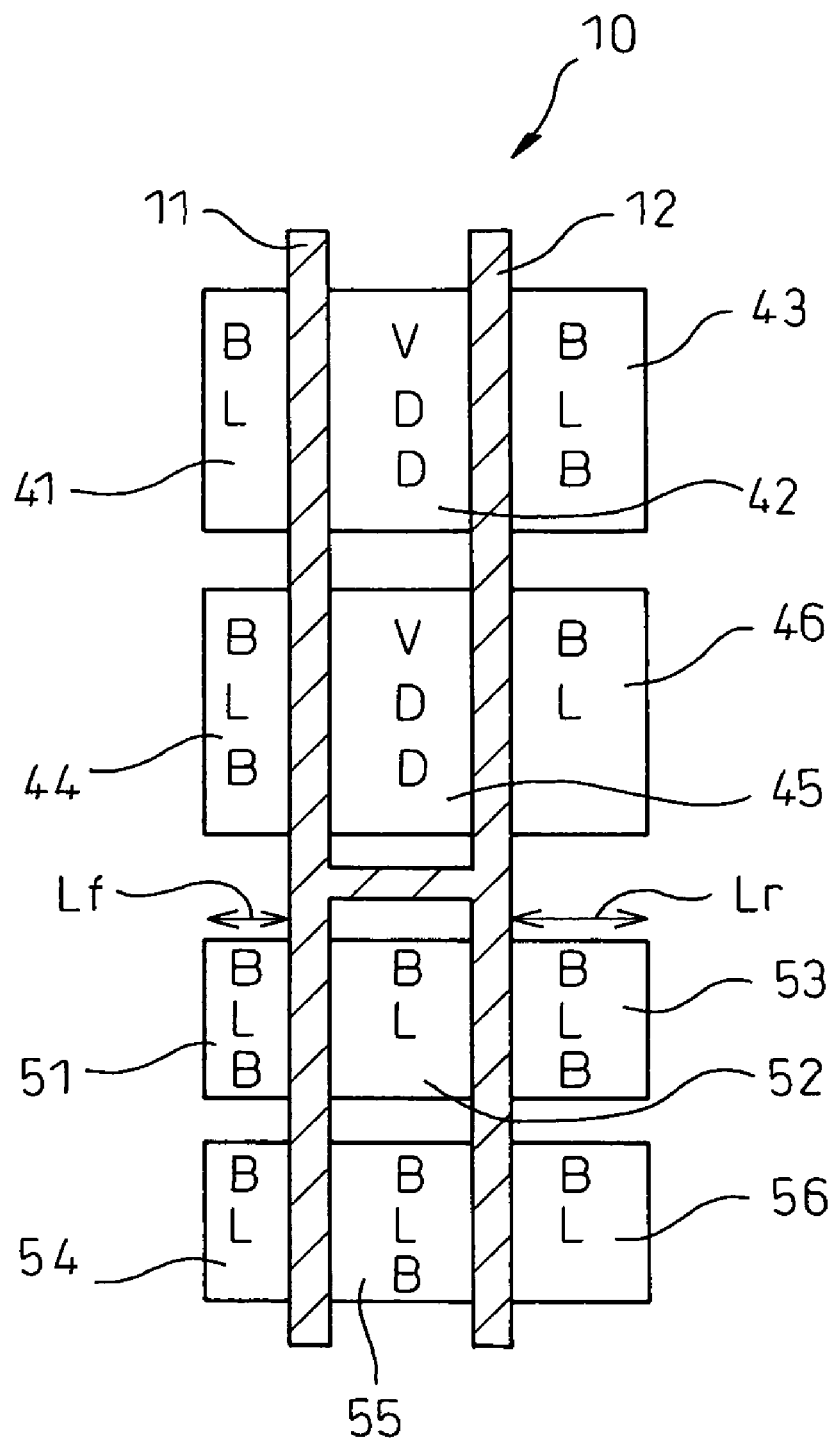

SEMICONDUCTOR DEVICE AND WIRING METHOD FOR SEMICONDUCTOR DEVICE

BACKGROUND OF THE INVENTION

1. Field of the Invention

The present invention relates to a semiconductor device and a wiring method and, more particularly, to a semiconductor device that is preferred as for a bit line control circuit in a memory and a wiring method for such semiconductor device.

2. Description of the Related Art

A Static Random Access Memory (SRAM) is a semiconductor memory that can operate at a high speed and, therefore, is used widely as a register or cache memory inside a central processing unit (CPU). In recent years, there has been an increasing demand for larger storage capacity and faster reading of the memory.

Each memory cell in a SRAM is connected with one word line and one bit line pair BL and BLB and, when the word line is set to "1", bit data is read and written via the bit line pair BL and BLB. The read operation, which is required to be faster, is typically performed by using a sense amplifier to amplify a small potential difference between BL and BLB in accordance with the value of the memory cell. (see Japanese Unexamined Patent Publication No. 2003-109379.)

The following approaches have been adopted in the related art so that the small potential difference between the bit lines can accurately reflect the value of the memory cell. One approach is to precharge both of the bit lines to High potential before the bit data is read by using two PMOS (Positive-channel Metal-Oxide Semiconductor) transistors, i.e, prechargers that can connect each bit line to the power supply voltage VDD. Another approach is to set both of the bit lines to the same potential by using one PMOS transistor, i.e. an equalizer, that can connect the bit lines with each other.

However, as the density of the memory cells is increased to increase the storage capacity, a load capacitance is also increased and, as a result, the voltage between the bit lines is reduced and any change becomes smaller. Therefore, if there is an variation in the load capacitance between the bit lines, stored data cannot be read accurately. In other words, the load capacitance values of BL and BLB must be exactly equal to each other so that a small voltage between BL and BLB can reflect the value of the memory cell. Thus, the load capacitance values of BL and BLB must be equal to each other to produce the SRAMs at a high yield.

In this connection, in order to prevent imbalance of the load capacitance due to mask deviations when wiring of the SRAM is formed, there has been proposed a technique to exchange positions halfway along two bit lines. (see Japanese Unexamined Patent Publication No. H02-89360.)

SUMMARY OF THE INVENTION

It is an object of the present invention to provide a semiconductor device that can reduce an imbalance in the load capacitance and is smaller.

In order to achieve the above object, there is provided a semiconductor device according to the present invention that includes first and second gates disposed adjacent to each other and a plurality of circuits, disposed in a longitudinal direction of the gates, wherein each of the plurality of circuits includes the first and second gates and three diffusion areas formed in a transverse direction of the first and second gates and the diffusion areas of the plurality of circuits are connected selectively.

The plurality of circuits include at least a first circuit provided with a first diffusion area, the first gate, a second diffusion area, the second gate and a third diffusion area in this order and a second circuit provided with a fourth diffusion area, the first gate, a fifth diffusion area, the second gate and a sixth diffusion area in this order, wherein the diffusion areas of the fist circuit may be connected selectively with the diffusion areas of the second circuit.

Further, the first and sixth diffusion areas, the third and fourth diffusion areas and the second and fifth diffusion areas may be connected respectively, or the first, third and fifth diffusion areas and the second, fourth and sixth diffusion areas may be connected respectively.

In the semiconductor device configured as described above according to the present invention, load capacitance does not vary even if positions between the gates and the diffusion areas are misaligned. Further, two transistors share one diffusion area so that semiconductor device can be made compact.

BRIEF DESCRIPTION OF THE DRAWINGS

These and other objects and features of the present invention will become clearer from the following description of the preferred embodiments given with reference to the attached drawings, wherein:

FIG. 1a is a diagram showing a conventional bit line control circuit;

FIG. 1b is a diagram schematically showing a semiconductor device implementing the circuit of FIG. 1a;

FIG. 2a is a diagram showing another conventional bit line control circuit;

FIG. 2b is a diagram schematically showing a semiconductor device implementing the circuit of FIG. 2a;

FIG. 3 is a diagram schematically showing possible deviations between gates and diffusion layers of FIG. 1b;

FIG. 5 is a diagram showing a bit line control circuit according to an embodiment of the present invention;

FIG. 7 is a diagram schematically showing possible deviations between gates and diffusion layers in the semiconductor circuit of FIG. 6.

DESCRIPTION OF THE PREFERRED EMBODIMENTS

Figure 4A:
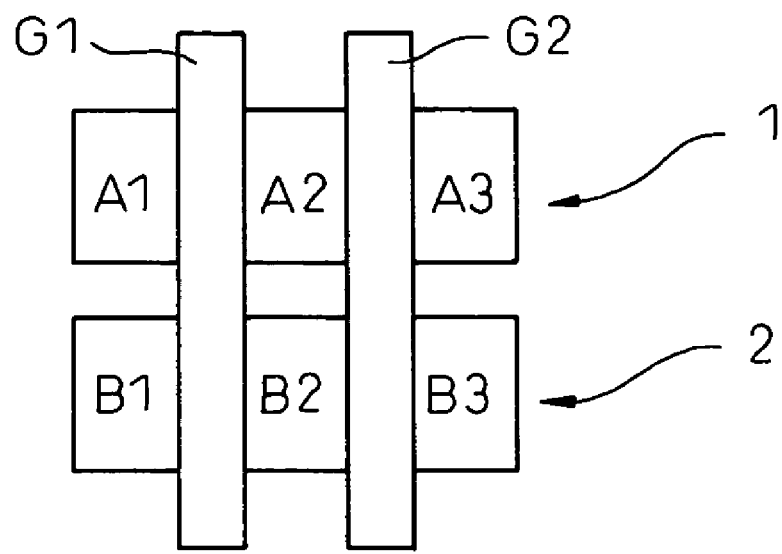
FIGS. 4a and 4b are diagrams conceptually showing the present invention.

Before describing embodiments of the present invention, a conventionally proposed related art will be described first and an overview of the present invention will be described in contrast with the related art so as to clarify the effects of the present invention.

FIG. 1a shows a bit line control circuit provided with a precharge circuit 60 and an equalizer circuit 70 connected to a conventional bit line pair. The precharge circuit 60 includes a P-channel metal oxide semiconductor (PMOS) transistor 61 that can connect the one bit line BL to a power supply voltage VDD, and a PMOS transistor 62 that can connect the other bit line BLB to the power supply voltage VDD. The equalizer circuit 70 includes a PMOS transistor 71, the source and drain of which are respectively connected to each of the bit lines. When a precharge signal PCH is input to the gates, the three transistors 61, 62 and 71 become conductive to set the potential of the bit line pair to the power supply voltage VDD or, in other words, the same voltage forcibly.

FIG. 1b shows a schematic diagram of a top side of the semiconductor integrated circuit constituting the bit line control circuit of FIG. 1a. In FIG. 1b, reference numerals 81 to 85 designate diffusion areas for forming the PMOS transistors and reference numerals 91 to 93 designate the gates, for example, made of polysilicon. Metal layers acting as wirings for electrical connection are omitted for the sake of clarity of the drawing. The gates 91 and 92 act as the gates of the PMOS transistors 61 and 62 constituting the precharge circuit 60. The diffusion area 81 corresponds to the drain of the PMOS transistor 61 that is connected to the bit line BL. The diffusion area 82 corresponds to the source of the PMOS transistor 61 that is connected to the power supply voltage VDD. Further, the diffusion area 83 is the drain of the PMOS transistor 62 that is connected to the bit line BLB. The diffusion area 82 is also the source of the PMOS transistor 61 that is connected to the power supply voltage VDD. Thus, the diffusion areas 81-83 and the gates 91 and 92 constitute the precharge circuit.

Further, the diffusion area 84, the gate 93 and the diffusion area 85 constitute the PMOS transistor 63 acting as the equalizer 70. The diffusion area 84 is connected to the bit line BL and the diffusion area 85 is connected to the bit line BLB.

In the conventional circuit shown in FIGS. 1a and 1b, as apparent from FIG. 1b, even though the precharge transistors or the PMOS transistors 61 and 62 are arranged in parallel, the equalizing transistor or the PMOS transistor 61 is arranged singly, so that free space is created on the both sides of the PMOS transistor 71 or on the outside of the diffusion areas 84 and 85. Thus, a high-density circuit cannot be obtained.

FIGS. 2a and 2b show another related art proposed for a high-density circuit. The elements identical to those in FIGS. 1a and 1b are designated by like reference numerals. FIG. 2a shows a circuit in which two PMOS transistors 72 and 73 arranged in parallel are used in place of the transistor 71 constituting the equalizer in the circuit of FIG. 1a. FIG. 2b shows a semiconductor integrated circuit implementing the equalizer of FIG. 2a. The semiconductor integrated circuit of FIG. 2b utilizes the free space adjacent to the diffusion areas 84 and 85 of FIG. 1b so that the equalizer can be made more compact.

More specifically, the equalizer circuit 70 of FIG. 2b has a diffusion area 87, a gate 95 and a diffusion area 86 that constitute the transistor 72, wherein the diffusion area 87, which acts as the source, is connected to the bit line BL and the diffusion area 86, which acts as the drain, is connected to the bit line BLB. Further, the equalizer circuit 70 of FIG. 2b also has a diffusion area 88, a gate 96 and a diffusion area 87 that constitute the transistor 73, wherein the diffusion area 88, which acts as the source, is connected to the bit line BLB and the diffusion area 87, which acts as the drain, is connected to the bit line BL. Thus, the diffusion area 87 connected to the bit line BL is shared by the transistors 72 and 73 so that the footprint of the equalizer circuit 70 can be reduced. However, the equalizer circuit 70 has an imbalance between a load capacitance of the bit line BL and that of the bit line BLB, because the diffusion areas BL and BLB have different sizes.

Further, such circuits have a common problem as described below. In general, in semiconductor manufacturing process in which various masks are used to form patterns repeatedly, any deviations between patterns for forming diffusion layers and patterns for forming gates will result in deviations of the positions between the diffusion layers and the gates. Such deviations, in turn, may result in lot-to-lot performance variation. FIG. 3 shows an example of deviations of patterns which can be caused by manufacturing the circuit of FIG. 1b. As apparent from the figure, the diffusion areas 81 and 83 in the precharge circuit have different widths and the diffusion areas 84 and 85 in the equalizer circuit have different widths. In both the precharge transistors and the equalizer transistors, dimensions of the diffusion areas connected to the bit line pair BL and BLB are different and the load capacitance of each of the bit lines becomes unbalanced. Similarly, also in the precharge circuit of FIG. 2b, any deviations of the positions between the diffusion layers and the gates may result in an imbalance between the load capacitance of the bit lines.

As will be described in further detail below, according to the present invention, it is possible to provide a semiconductor device that has a high-density circuit without making the load capacitance of the bit line pair unbalanced.

Figure 4B:
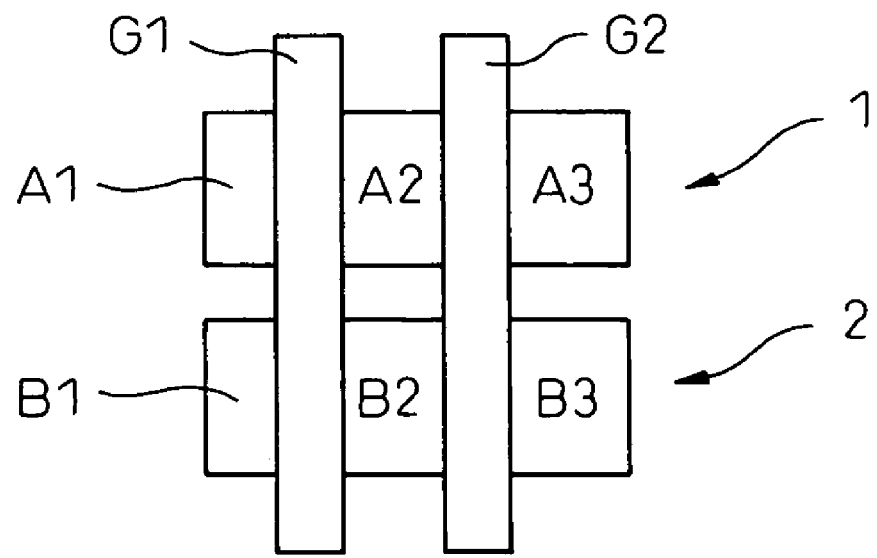

FIG. 4a is a diagram schematically showing a semiconductor device according to the present invention. The semiconductor device according to the present invention includes gates G1 and G2, diffusion areas A1 to A3, and diffusion areas B1 to B3. The diffusion area A1, the gate G1, the diffusion area A2, the gate G2 and the diffusion area A3 constitute a first circuit 1 including two transistors, and the diffusion area B1, the gate G1, the diffusion area B2, the gate G2 and the diffusion area B3 constitute a second circuit 2 including two transistors. According to the present invention, any one of the diffusion areas A1 to A3 of the first circuit 1 is selectively connected to any of the diffusion areas B1 to B3 of the second circuit 2. For example, the diffusion areas A1 and B3 and the diffusion areas A3 and B1 are connected respectively, or the diffusion areas A1, A3 and B2 and the diffusion areas A2, B1 and B3 are connected respectively. In this case, as can be seen from FIG. 4b, even if there are deviations of the positions between the diffusion layers and the gates in manufacturing process, the size of the diffusion areas is:

$(A1)+(B3)=(A3)+(B1)$=constant, or $(A1)+(A3)+(B2)=(A2)+(B1)+(B3)$=constant, and, therefore, the load capacitance of the two diffusion areas does not vary and the imbalance of the load capacitance does not occur. Further, the two transistors in each circuit share one diffusion area, respectively, so that the circuit can be made relatively smaller.

Hereinafter, an embodiment of the present invention will be described with reference to FIGS. 5 to 7. FIG. 5 shows a bit line control circuit 10 of this embodiment that is connected to a plurality of memory cells 40 in an SRAM. The SRAM includes a plurality of memory cells arranged in a matrix manner. Each memory cell includes six transistors, among which four transistors in the center form cross-coupled inverters. The memory cell can store one-bit value and be written/read via the bit line pair BL and BLB when the word line WL is set to "1". The memory cell can be read by using a sense amplifier (not shown) to amplify a small voltage difference between the bit lines BL and BLB.

The bit line control circuit 10 includes a precharge circuit 20 and an equalizer circuit 30. Before reading of the memory cell, a precharge signal PCH is applied to the gates of each transistor so that the bit line pair BL and BLB in the precharge circuit 20 is charged to the power supply voltage VDD and the voltages of the bit line pair BL and BLB in the equalizer circuit 30 are made equal to each other.

In this embodiment, the precharge circuit 20 and the equalizer circuit 30 are both configured so that the circuits are divided into two elements arranged in parallel to be aligned in the direction of the bit line. As is apparent from a comparison between FIG. 5 and FIG. 2a, the precharge circuit 20 and the equalizer 30 are both divided into two elements and the transistors are arranged doubly in the direction of the bit line.

The precharge circuit 20 is divided into two circuits arranged in parallel, one of which includes PMOS transistors 21 and 22 and the other of which includes PMOS transistors 23 and 24. The transistor 21 can connect the power supply voltage VDD to the bit line BL and the transistor 22 can connect the power supply voltage VDD to the bit line BLB. Further, the transistor 23 that is formed downstream from the transistor 21 in the direction of the bit line BL can connect the power supply voltage VDD to the bit line BLB and the transistor 24 that is formed downstream from the transistor 22 in the direction of the bit line BLB can connect the power supply voltage VDD to the bit line BL.

The equalizer circuit 30 is divided into two circuits arranged in parallel, one of which includes PMOS transistors 31 and 32 and the other of which includes PMOS transistors 33 and 34. The transistor 31 connects the source to the bit line BL and connects the drain to the bit line BLB. On the contrary, the transistor 32 connects the source to the bit line BLB and connects the drain to the bit line BL. Further, the transistor 33 that is formed downstream from the transistor 31 in the direction of the bit line BL connects the source to the bit line BLB and connects the drain to the bit line BL in contrast to the transistor 31, and the transistor 34 that is formed downstream from the transistor 32 in the direction of the bit line BLB connects the source to the bit line BL and connects the drain to the bit line BLB in contrast to the transistor 32. When a signal is given to the gates of the transistors 31 to 34 connected as described above to make them conductive, the bit lines BL and BLB are set to the same potential forcibly.

Figure 6:
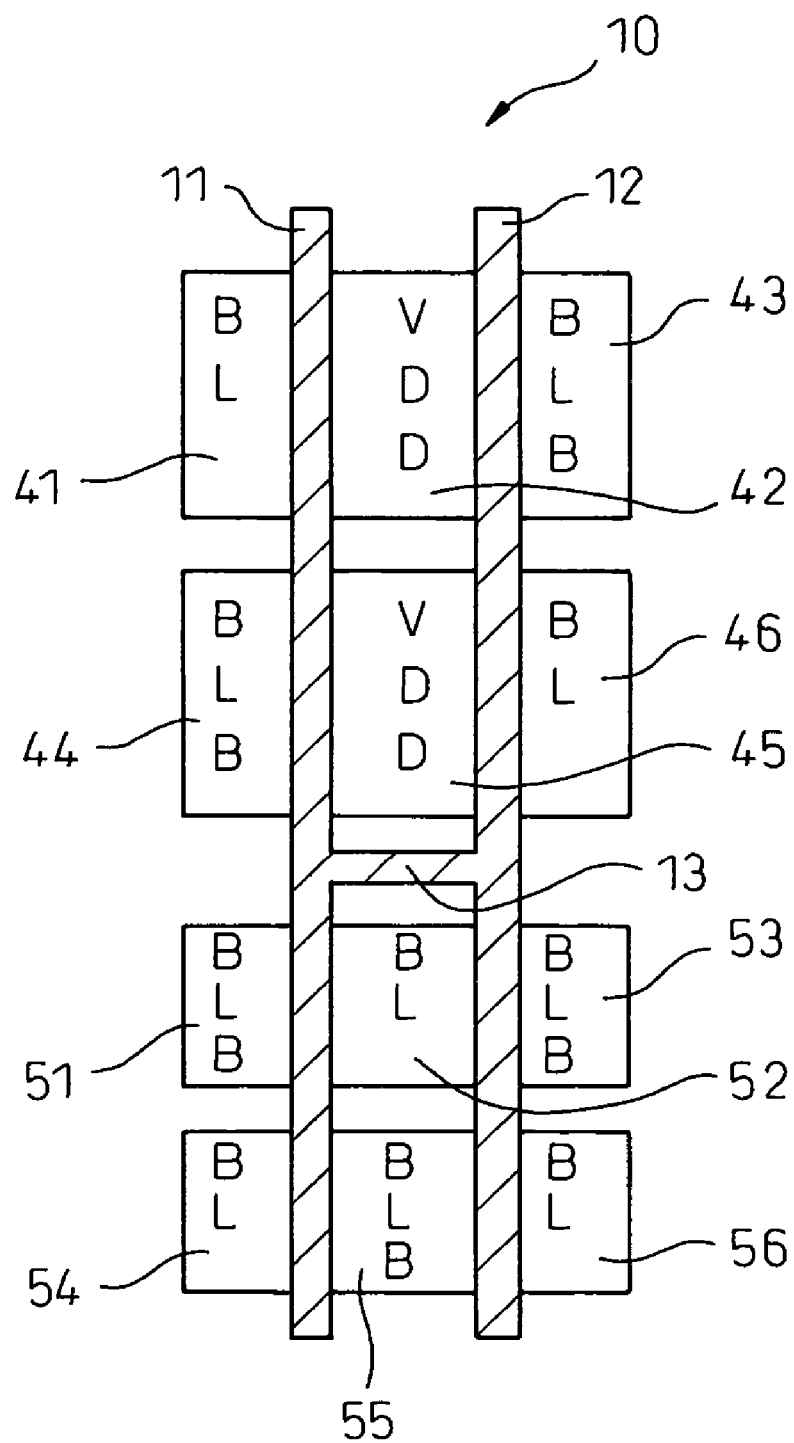
FIG. 6 is a diagram schematically showing a semiconductor device implementing the bit line control circuit of FIG. 5.

FIG. 6 shows a schematic top view of a circuit configuration implementing the circuit of FIG. 5 as a semiconductor integrated circuit. The shaded areas designate the gates and blocks designate diffusion areas. Wiring layers for connection are omitted for ease of the understanding of the drawing.

The gates of the transistors 21, 23, 31 and 33 aligned along the bit line BL in FIG. 5 correspond to a gate 11 in FIG. 6 and the gates of the transistors 22, 24, 32 and 34 in FIG. 5 correspond to a gate 12 in FIG. 6. As shown in FIG. 5, the gates are connected mutually. In FIG. 6, the mutual connection is performed by connecting the gate 11 and the gate 12 at a connecting part 13. The precharge circuit 20 includes diffusion areas 41 to 45 and the gates 11 and 12, and the equalizer circuit 30 includes diffusion areas 51 to 56 and the gates 11 and 12.

In the precharge circuit 20, the transistor 21 has the diffusion areas 41 and 42 on the both sides of the gate 11, wherein the diffusion area 41 is the drain connected to the bit line BL and the diffusion area 42 is the source connected to the power supply voltage VDD. Then, the transistor 22 has the diffusion areas 43 and 42 on the both sides of the gate 12, wherein the diffusion area 43 is the drain connected to the bit line BLB and the diffusion area 42 is the source connected to the power supply voltage VDD. Further, the transistor 23 has the diffusion areas 44 and 45 on the both sides of the gate 11, wherein the diffusion area 44 is the drain connected to the bit line BLB and the diffusion area 45 is the source connected to the power supply voltage VDD. The transistor 24 has the diffusion areas 46 and 45 on the both sides of the gate 12, wherein the diffusion area 46 is the drain connected to the bit line BL and the diffusion area 45 is the source connected to the power supply voltage VDD.

Comparison between the transistors 21 and 23 arranged in the direction of the bit line shows that the sources of both transistors are connected to the power supply voltage, while the drain of the transistor 21 is connected to the bit line BL but the drain of the transistor 23 is connected to the bit line BLB. Similarly, the sources of the transistors 22 and 24 divided in the direction of the bit line are connected to the power supply potential, while the drains of the transistors 22 and 24 are connected to the bit lines BLB and BL, respectively.

In the equalizer circuit 30, the transistor 31 has the diffusion areas 52 and 51 on the both sides of the gate 11, wherein the diffusion area 52 is the source connected to the bit line BL and the diffusion area 51 is the drain connected to the bit line BLB. Then, the transistor 32 has the diffusion areas 53 and 52 on the both sides of the gate 12, wherein the diffusion area 53 is the source connected to the bit line BLB and the diffusion area 52 is the drain connected to the bit line BL. Further, the transistor 33 has the diffusion areas 55 and 54 on the both sides of the gate 11, wherein the diffusion area 55 is the source connected to the bit line BLB and the diffusion area 54 is the drain connected to the bit line BL. Still further, the transistor 34 has the diffusion areas 56 and 55 on the both sides of the gate 12, wherein the diffusion area 56 is the source connected to the bit line BL and the diffusion area 55 is the drain connected to the bit line BLB.

As described above, when the precharge and equalizer circuits are respectively divided into two circuits and the diffusion areas are connected selectively to the bit line pair BL and BLB as shown in FIG. 5, the diffusion area 41 connected to the bit line BL, the diffusion area 44 connected to the bit line BLB, the diffusion area 51 connected to the bit line BLB and the diffusion area 54 connected to the bit line BL are aligned from above to below on the left side of the figure, and the diffusion area 43 connected to the bit line BLB, the diffusion area 46 connected to the bit line BL, the diffusion area 53 connected to the bit line BLB and the diffusion area 56 connected to the bit line BL are aligned on the right side of the figure.

FIG. 7 shows an example in which deviations can occur between the diffusion areas and the gates when the bit line control circuit configured as shown in FIG. 6 is manufactured in semiconductor manufacturing process. In the figure, the width Lf of the left diffusion areas is smaller than the width Lr of the right diffusion areas.

However, from the viewpoint of the load capacitance of the bit lines BL and BLB, in the precharge circuit, the diffusion areas 41 and 46, which are connected to the bit line BL, and the diffusion areas 43 and 44, which are connected to the bit line BLB, are divided to the left and right, respectively, and the size of these diffusion areas is:

(diffusion area 41)+(diffusion area 46)=(diffusion area 43)+(diffusion area 44)=constant and, therefore, the load capacitance of each of the bit lines does not vary even if the deviations occur between the diffusion areas and the gates.

Further, in the equalizer circuit, the diffusion areas 52, 54 and 56 are connected to the bit line BL and the diffusion areas 51, 53 and 55 are connected to the bit line BLB and the size of these diffusion areas is:

(diffusion area 52)+(diffusion area 54)+(diffusion area 56)=(diffusion area 51)+(diffusion area 53)+(diffusion area 55)=constant and, therefore, the load capacitance of each of the bit lines does not vary even if the deviations occur between the diffusion areas and the gates.

What is claimed is:
1. A semiconductor device comprising:
a memory cell;

a first bit line and a second bit line each connected to the memory cell;

a first gate and a second gate disposed in parallel to each other;

a first circuit controlling the memory cell provided with a first diffusion area formed outside of the first gate, a second diffusion area formed between the first gate and the second gate and a third diffusion area formed outside of the second gate; and a second circuit controlling the memory cell provided with a fourth diffusion area formed outside of the first gate, a fifth diffusion area formed between the first gate and the second gate and a sixth diffusion area formed outside of the second gate;

wherein the first diffusion area is connected with the sixth diffusion area via the first bit line, the third diffusion area is connected with the fourth diffusion area via the second bit line, and the second diffusion area is connected with the fifth diffusion area via a power supply.

2. A semiconductor device according to claim 1, further comprising:

a third circuit controlling the memory cell provided with a seventh diffusion area formed outside of the first gate, an eighth diffusion area formed between the first gate and the second gate, and a ninth diffusion area formed outside of the second gate;

a fourth circuit controlling the memory cell provided with a tenth diffusion area formed outside of the first gate, an eleventh diffusion area, formed between the first gate and the second gate, and a twelfth diffusion area formed outside of the second gate;

the seventh, ninth and eleventh diffusion areas being connected with the first bit line; and the eighth, tenth and twelfth diffusion areas being connected with the second bit line.

* * * * *